United States Patent
Bothra

Patent Number: 6,156,626
Date of Patent: Dec. 5, 2000

[54] ELECTROMIGRATION BONDING PROCESS AND SYSTEM

[75] Inventor: Subhas Bothra, San Jose, Calif.

[73] Assignee: Philips Electronics North America Corp., New York, N.Y.

[21] Appl. No.: 09/259,744

[22] Filed: Feb. 27, 1999

[51] Int. Cl.[7] .............. H01L 21/479; H01L 21/326; H01L 21/44; H01L 21/48; H01L 21/50

[52] U.S. Cl. .............. 438/470; 438/468; 438/107

[58] Field of Search .............. 438/107, 468, 438/470

[56] References Cited

U.S. PATENT DOCUMENTS

| | | | |
|---|---|---|---|
| 3,256,598 | 6/1966 | Kramer | 29/484 |
| 4,534,100 | 8/1985 | Lane | 29/586 |
| 4,549,912 | 10/1985 | Anthony | 148/33.1 |

*Primary Examiner*—Charles Bowers
*Assistant Examiner*—Nema Berezny
*Attorney, Agent, or Firm*—Martine Penilla & Kim, LLP

[57] ABSTRACT

A process and system for connecting a semiconductor chip to a substrate is provided. The process includes providing the substrate that is configured to receive the semiconductor chip that has a bonding pad. The substrate has a first side that is suited to be connected to the semiconductor chip and a second side that is opposite the first side. The process then includes designing a metallization bonding structure on the first side of the substrate. The metallization bonding structure has a first end, a second end, and a bend defined between the first end and the second end. Then, an oxide passivation layer is defined over the first side that includes the metallization bonding structure. A bonding via is then defined through the passivation layer. The bonding via is configured to be aligned with the bend of the metallization bonding structure. The semiconductor chip is then joined to the oxide passivation layer, such that the bonding pad is aligned with the bonding via and the bend of the metallization bonding structure. The process further includes the application of a current between the first end and the second end of the metallization bonding structure. The applied current is configured to cause a flow of electrons in an opposite direction of the current and a flow of metallization atoms in the metallization bonding structure toward the bend and into the bonding via. A reliable conductive bond between the substrate and the bonding pad of the semiconductor chip is thus established without the need for wire bonds or solder bumps.

20 Claims, 10 Drawing Sheets

ELECTROMIGRATION BONDING PROCESS AND SYSTEM

BACKGROUND OF THE INVENTION

1. Field of the Invention

The present relates to the packaging of semiconductor chips. More particularly, the present invention relates to a process and system for performing electrical bonding of semiconductor chips to packaging substrates.

2. Description of the Related Art

Recently, there has been tremendous advances in the fabrication of semiconductor devices, which have led to the continued development of smaller and smaller semiconductor chips. Unfortunately, the packaging of these smaller semiconductor chips is lagging behind in the ability to scale down the packaging dimensions. In fact, the 1997 National Technology Road Map for Semiconductors (NTRS), as published by the Semiconductor Industry Association (SIA) (1997), has identified packaging as a critical concern area, in that current packaging technologies fail to accommodate the continued scaling of on-chip interconnects.

Conventionally, semiconductor chips are connected to a package by way of wire bonds or solder bumps. As is well known, wire bonding requires that the semiconductor chip have bonding pads of a sufficient size to enable the wire bonding machines to connect the wire bonds between the semiconductor chip and the package. As a result, even though designers are able to scale down the physical size of the bonding pads resident on the semiconductor chip, the need to perform the appropriate wire bonding forces designers to layout physically larger bonding pads over the semiconductor chip.

The need for larger bonding pads over the semiconductor chip also has the down side of crowding the bonding pad arrangement, which necessarily requires reduced and staggered pad pitch arrangements. In certain high performance devices, the semiconductor chip will require a higher bonding pad count to meet particular input/output (I/O) requirements. Because the bonding pads on the semiconductor chip can only be reduced so much in view of the need to provide bonding pad surfaces that are of a size capable of receiving bonding wires, chip designers are typically forced to unnecessarily increase the size of chip.

When solder bumps are implemented to connect the semiconductor chip to a package, there is still a need to design bonding pad surfaces over the chip that will be large enough to receive the solder material. A further limitation associated with solder bumps is that the bonding pads over the chip must be separated from each other by a sufficient amount of space to avoid having shorts between adjacent bond pad overflows. Although solder bump chip-to-package connection does provide for a more dense arrangement of bonding pads relative to wire bonding, the solder bump bonding process does require more costly techniques for applying the solder material to the arrangement, connecting the chip to the package, and associated heat treatments to complete the bonding. In addition, solder bumping processes also have the down side of inducing well known alpha-particle damage. For instance, alpha-particle damage occurs when alpha-particles generated by lead solder bumps enter the device active area and generate electron hole pairs and the charge generated by the electron hole pairs upset the potential of the device, thus potentially causing failures.

In view of the foregoing, there is a need for processes and systems for more efficiently bonding semiconductor chips to package substrates. More particularly, there is a need for processes that will enable fast and efficient bonding connections between semiconductor chips and packages, wherein the packages can be reduced in size to a true chip-scale size.

SUMMARY OF THE INVENTION

Broadly speaking, the present invention fills these needs by providing a semiconductor packaging process and system that implements electromigration characteristics of metallization materials to effectuate the bonding process between the semiconductor chip and the semiconductor package. It should be appreciated that the present invention can be implemented in numerous ways, including as a process, an apparatus, a system, a device, or a method. Several inventive embodiments of the present invention are described below.

In one embodiment, a process for connecting a semiconductor chip to a substrate is disclosed. The process includes providing the substrate that is configured to receive the semiconductor chip that has a bonding pad. The substrate has a first side that is suited to be connected to the semiconductor chip and a second side that is opposite the first side. The process then includes designing a metallization bonding structure on the first side of the substrate. The metallization bonding structure has a first end, a second end, and a bend defined between the first end and the second end. Then, an oxide passivation layer is defined over the first side that includes the metallization bonding structure. A bonding via hole is then defined through the passivation layer. The bonding via hole is configured to be aligned with the bend of the metallization bonding structure. The semiconductor chip is then joined to the oxide passivation layer, such that the bonding pad is aligned with the bonding via hole and the bend of the metallization bonding structure. The process further includes the application of a current between the first end and the second end of the metallization bonding structure. The applied current is configured to cause a flow of electrons in an opposite direction of the current and a flow of metallization atoms in the metallization bonding structure toward the bend and into the bonding via hole. A reliable conductive bond between the substrate and the bonding pad of the semiconductor chip is thus established by the metal-filled bonding via hole, without the need for wire bonds or solder bumps.

In another embodiment, a system for bonding a semiconductor chip having a plurality of bonding pads to a substrate is disclosed. The system includes defining a plurality of metallization bonding structures throughout the substrate. The metallization bonding structures have a first end, a second end, and a bend that is between the first end and the second end. Then, an insulator layer is defined between the plurality of bonding pads and the substrate. The insulator layer has a plurality of via holes that align with the bends in each of the metallization bonding structures. The semiconductor chip is then joined to the substrate, such that the plurality of bonding pads and the plurality of via holes are aligned with the bends in each of the plurality of metallization bonding structures. A plurality of conductive bonding vias are defined through the substrate, such that an electrical connection is established between first ends and second ends of the plurality of metallization bonding structures. The system then includes the application of a current to pairs of the plurality of conductive bonding vias. The application of current is thus configured to cause electromigration of metallization atoms along the metallization bonding structure so as to fill the plurality of via holes with the metallization atoms.

In yet another embodiment, a method for bonding a semiconductor chip having a plurality of bonding pads to a package is disclosed. The method includes forming a plurality of metallization bonding structures throughout the package. The metallization bonding structures have a first end, a second end, and a bend that is between the first end and the second end. The method further includes forming an insulator layer between the plurality of bonding pads and the package, such that the insulator layer has a plurality of via holes that align with the bends in each of the metallization bonding structures. Then, the method proceeds to attaching the semiconductor chip to the package, such that the plurality of bonding pads and the plurality of via holes are aligned with the bends in each of the plurality of metallization bonding structures. A plurality of conductive bonding vias are thus defined through the package, such that an electrical connection is established between first ends and second ends of the plurality of metallization bonding structures. The method further includes applying a current to pairs of the plurality of conductive bonding vias. The current application is thus configured to cause electromigration of metallization atoms along the metallization bonding structure so as to fill the plurality of via holes with the metallization atoms. The filled plurality of via holes thereby define electrical bonds between the semiconductor chip and the package.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings. Therefore, like reference numerals designate like structural elements.

DETAILED DESCRIPTION OF THE PREFERRED EMBODIMENTS

An invention for a semiconductor packaging process and system that implements electromigration characteristics of metallization materials to effectuate the bonding process between the semiconductor chip and the semiconductor package is disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1A:
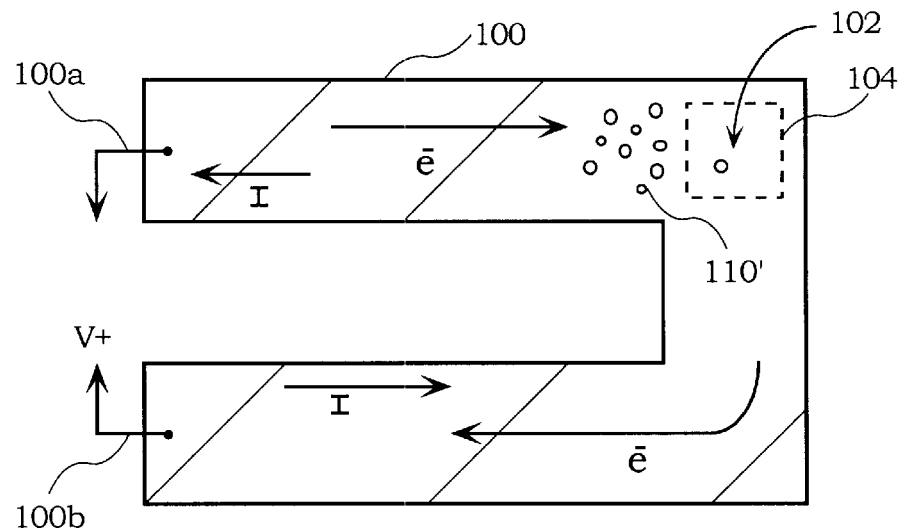
FIG. 1A shows a top view of a metallization bonding structure implemented in a bonding by electromigration (BEM) process, in accordance with one embodiment of the present invention.

FIG. 1A shows a top view of a metallization bonding structure 100 implemented in a bonding by electromigration (BEM) process, in accordance with one embodiment of the present invention. The metallization bonding structure 100 is preferably arranged in a geometric shape that will promote an electromigration stress region 102 when current is driven along the metallization bonding structure 100.

Electromigration is commonly understood to be the result of an average current flow through a conductor. The flowing electrons transfer a fraction of their momentum to the metal atoms from the scattering process. This momentum transfer in turn causes a movement of the metal atoms (i.e., mass transfer) in the direction of electron flow. Therefore, the amount of momentum transfer, and resulting metal flow, increases with increasing current density. This flow of material is seldom uniform and regions of tensile stress develop where there is a net loss of material over time and regions of compressive stress develop where there is a new increase of material over time (e.g., the bend at 102).

As shown, the metallization bonding structure 100 has a ground bonding connection 100a at one end of the structure and a positive voltage bonding connection 100b at the other end. By applying a voltage differential, a current "I" is caused to flow from the positive voltage bonding connection 100b toward the ground bonding connection 100a. This current flow therefore causes a flow of electrons "é" in the opposite direction flowing from the ground bonding connection 100a toward the positive voltage bonding connection 100b. As a result of the electron flow, an electromigration of metallization atoms 110' will flow from the ground bonding connection 100a toward the positive voltage bonding connection 100b. Thus, the electromigrating metallization atoms 110' will flow toward the corner bend of the metallization bonding structure 100, and thereby cause the electromigration stress region 102. The electromigration stress region 102 will therefore result in a substantially increased concentration of electromigration metallization atoms 110'.

To accomplish the bonding by electromigration (BEM) process, an underlying bonding via 104 is positioned below the electromigration stress region 102 of the metallization bonding structure 100. By placing the underlying bonding via 104 in such a location, the increased electromigration metallization atom concentration 110' will be forced to flow down into the underlying bonding via 104 as shown in FIG. 1C. As will be discussed in greater detail below, when the bonding via 104 becomes filled, an electrical bonding link will be advantageously established between the chip and the package. This bond link is of course formed without the need for conventional wire bonds or solder ball bonds, which as described above, may require larger chip and package arrangements.

Figure 1B:
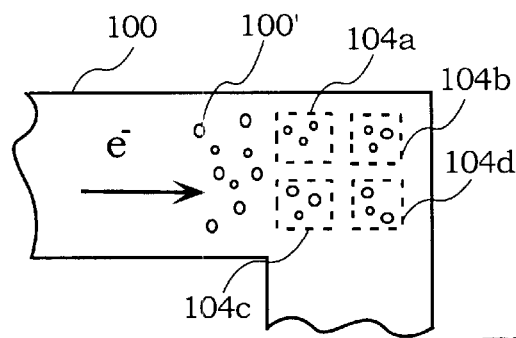
FIG. 1B illustrates another embodiment of the present invention, in which the underlying bonding via is replaced with a plurality of smaller underlying bonding vias.
Figure 1C:
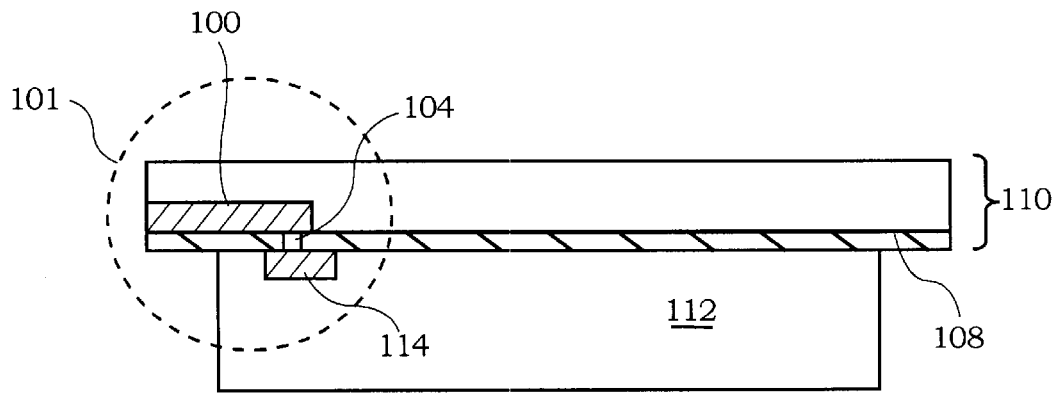
FIG. 1C illustrates an example of how the metallization bonding structure can be integrated as part of a package, in accordance with one embodiment of the present invention.

FIG. 1B illustrates another embodiment of the present invention, in which the underlying bonding via 104 is replaced with a plurality of underlying bonding vias 104a through 104d. In a similar manner as discussed above, the electromigrating metallization atoms 110' will flow down into the underlying bonding vias when a current is caused to flow between corresponding ends of the metallization bonding structure 100. From this embodiment, is should become apparent that the underlying vias can be of any shape and can include one or more vias of differing sizes, depending upon the IC chip being bonded and its associated packaging specifications.

In one embodiment, FIG. 1C illustrates how the metallization bonding structure 100 can be integrated as part of a package 110. The package 110 will, in this embodiment, include an oxide passivation material 108, such as silicon nitride and oxide which electrically insulates the various bond pads and other exposed metal lines of the IC chip 112 from one another. The passivation material 108, as will be discussed below, can also be formed as part of the IC chip itself. In this example, the IC chip 112 is shown having one exemplary on-chip metallization pad 114 which is configured to be bonded to the package 110 through the underlying bonding via 104.

As mentioned above, when the appropriate current is passed through the metallization bonding structure 100, the electromigration of metallization atoms will allow the metallization atoms to flow down into the underlying bonding via 104 and cause an electrical interconnection between the package 110 and the IC chip 112. Of course, it should be understood that the IC chip 112 will in practice, have a multitude of on-chip metallization pads 114 which will be interconnected to associated metallization bonding structures 100 throughout the package 110.

Figure 1D:
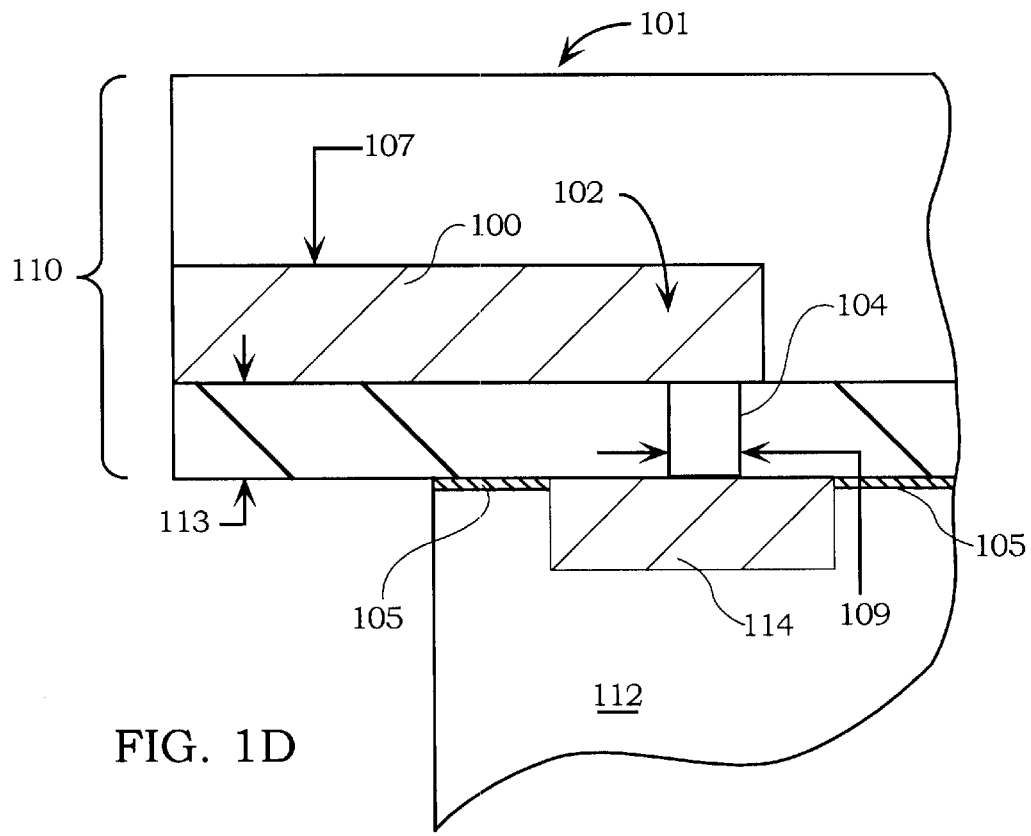
FIG. 1D illustrates a more detailed view of the package/chip combination of FIG. 1C.

FIG. 1D illustrates a more detailed view 101 of the package 110 and IC chip 112 combination of FIG. 1C. From this perspective, the underlying bonding via 104 is shown to be defined in the oxide passivation material 108 of the package 110. This via will therefore enable a connection between the package 110 and the IC chip 112 once a current is caused to flow through the metallization bonding structure 100 as mentioned above. Although any well known techniques may be used for attaching the IC chip 112 to the package 110, an interface dielectric 105 may be used in order to establish a suitable bond between the package and the IC chip.

In this exemplary diagram of FIG. 1D, the thickness 107 of the metallization bonding structure 100 may be between about 5 microns and about 20 microns. The exemplary diameter 109 of the via 104, when one larger via is used, may be between about 1 micron and 10 microns. When multiple small vias 104 are used, as in the example of FIG. 1B, the diameter of the vias may range between about 0.4 micron and about 10 microns. Continuing along with the exemplary dimensions, the oxide passivation material 108 may have a thickness 113 that ranges between about 1 micron and about 3 microns.

In a specific BEM bonding example, the metallization bond structure 100 can be made to receive a current density ranging between about $1 \times 10^5$ amp/cm$^2$ and about $1 \times 10^6$ amp/cm$^2$. An associated bonding temperature for this range of current density may be, for example, between about 300 degrees C and about 400 degrees C. In a more preferred embodiment, the current density may be about $5 \times 10^5$ amp/cm$^2$ when a temperature of about 350 degrees C is maintained during the BEM process.

Figure 1E:
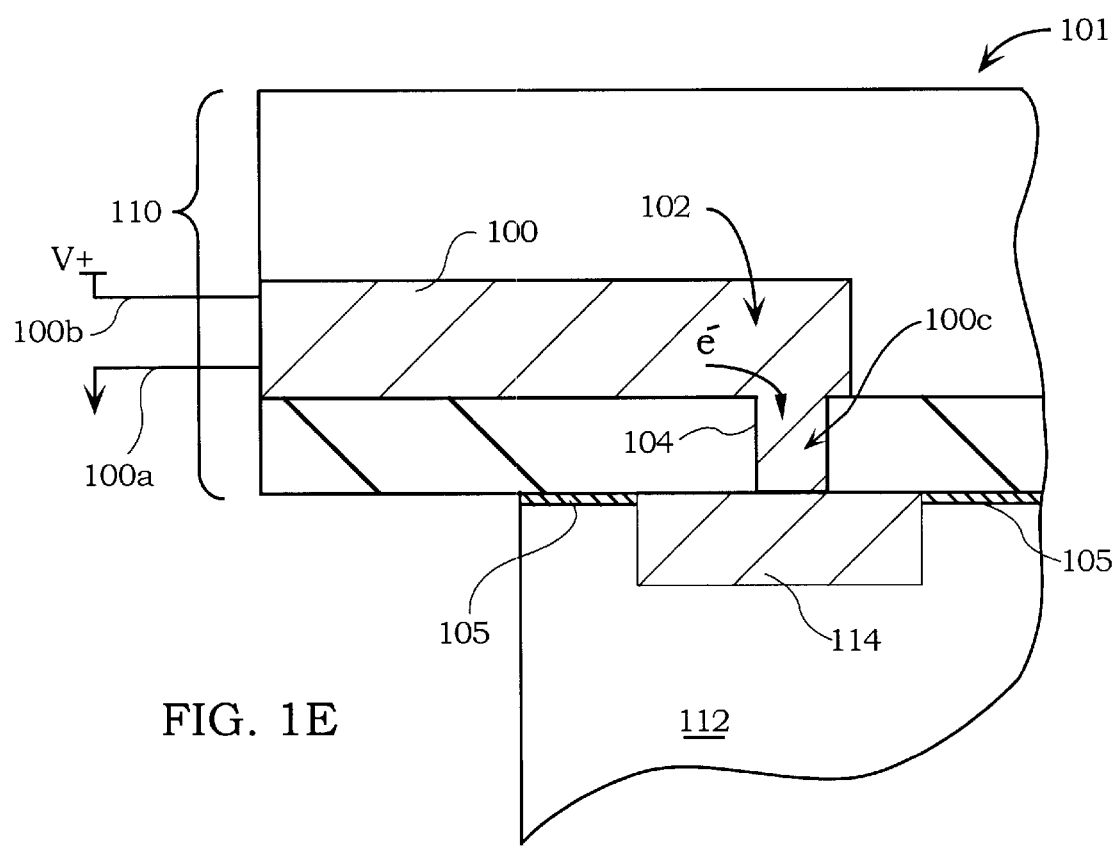
FIG. 1E illustrates a bonded connection between the package and the IC chip.

FIG. 1E provides an illustration of the BEM process that causes electrons to flow in a direction suitable to cause the electromigration stress region 102 over the underlying bonding via 104. Once the ground bonding connection 100a and the positive voltage bonding connection 110b is suitably interconnected to the metallization bonding structure 100, an electromigration flow of metallization atoms will allow the metallization material of the package 110 to flow into the underlying bonding via 104 and cause a suitable electrical connection with the on-chip metallization pad 114.

Typically, the package 110 will implement metallization such as gold (Au) and the IC chip 112 will implement metallization such as aluminum (Al). The resulting interconnection between the metallization bonding structure 100 and the on-chip metallization pad 114 will consist of aluminum and gold compounds. Of course, it should be understood that the metallization of the metallization bonding structure 100 may also be copper, aluminum, or any other suitable metallization material. The metallization used in the IC chip 112 can be selected from other suitable materials, such as copper. As is well known, copper is typically used when a damascene process (e.g., oxide etch, metal deposition, and planarization) is implemented to form the interconnect metallization lines throughout the IC chip 112. In either case, the BEM process will enable bonding between the package 110 and the IC chip to be a purely electrical process, as opposed to implementing wire bonds or solder balls as discussed above.

Figure 1F:
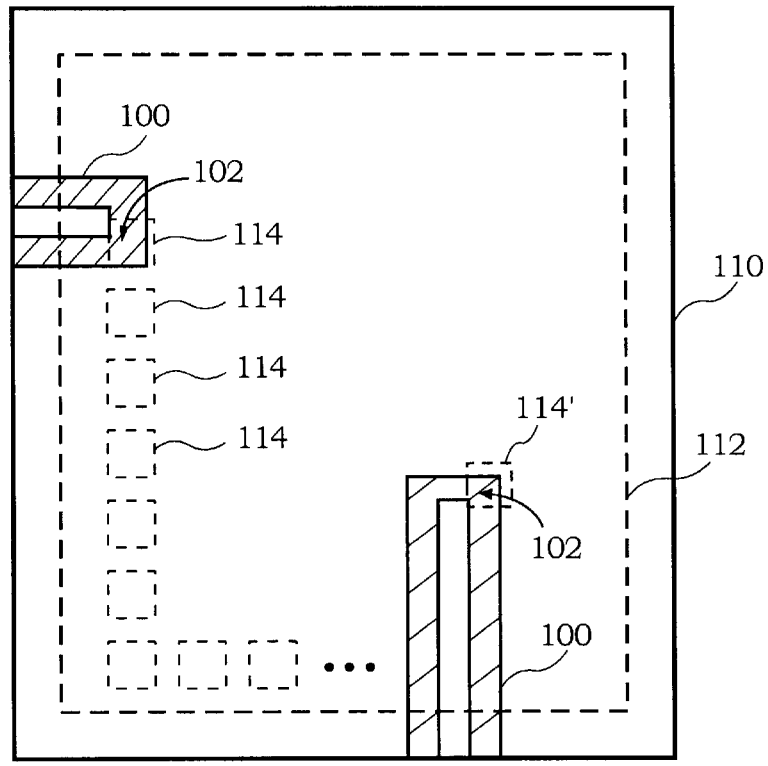
FIG 1F is a top view of a package and the metallization bonding structure, in accordance with one embodiment of the present invention.

FIG. 1F provides a top view of the package 110 and an underlying IC chip 112 shown with dashed lines. In this example, the IC chip 112 is shown having on-chip metallization pads 114 along the periphery of the chip. This package 110 is shown having an exemplary metallization bonding structure 100 overlying one of the on-chip metallization pads 114. In FIG. 1E, when the appropriate current is passed along the metallization bonding structure 100, the electromigration stress region 102 will occur at a particular corner bend of the metallization bonding structure 100.

The electromigration stress region 102 may therefore occur at either corner of the metallization bonding structure 100, depending upon the direction in which current/electrons are flowing through the metallization bonding structure 100. The metallization bonding structure 100 may also be used to interconnect to on-chip metallization pads that are designed over the core region of the IC chip 112.

For example, one on-chip metallization pad 114' is shown lying over the IC chip 112 at about the core region of the chip. To establish a bond between the package 110 and the IC chip 112, a suitable metallization bonding structure 100 is provided to reach toward the on-chip metallization pad 114' and thus, produce an electromigration stress region 102 suitable to cause the bonding between the package 110 and the IC chip 112. Accordingly, it should be understood that the metallization bonding structure 100 can be implemented to achieve bonding interconnections between the IC chip 112 and the package 110 at any location throughout the IC chip 112.

Figure 2A:
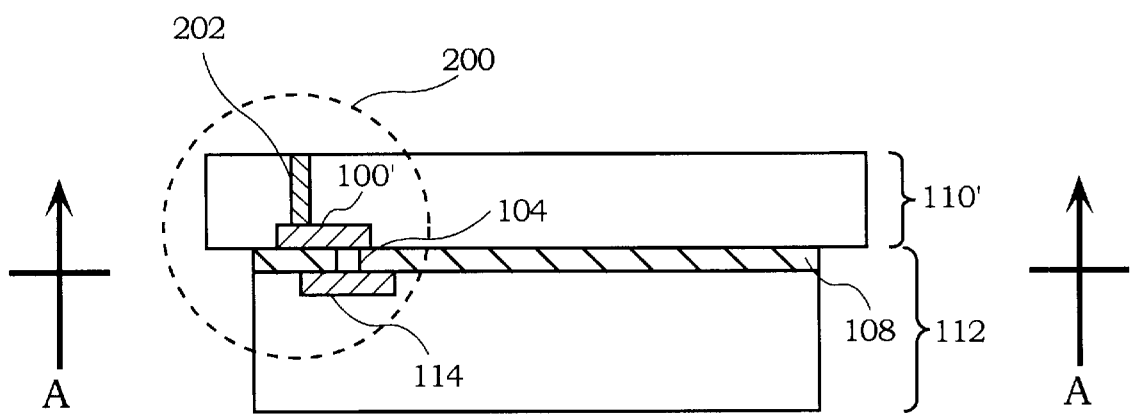
FIG. 2A shows another embodiment of the present invention, in which, an IC chip is attached to the package through the use of a suitable metallization bonding structure.

FIG. 2A shows another embodiment of the present invention, in which, an IC chip 112 is attached to the package 110' through the use of a suitable metallization bonding structure 100'. In this embodiment, the IC chip 112 itself will preferably have an oxide insulative material 108 through which a via 104 is defined down to the on-chip metallization pad 114. In addition, the package 110' will preferably have a plurality of conductive bonding vias 202 that make suitable connections down to the metallization bonding structure 100.

Figure 2B:
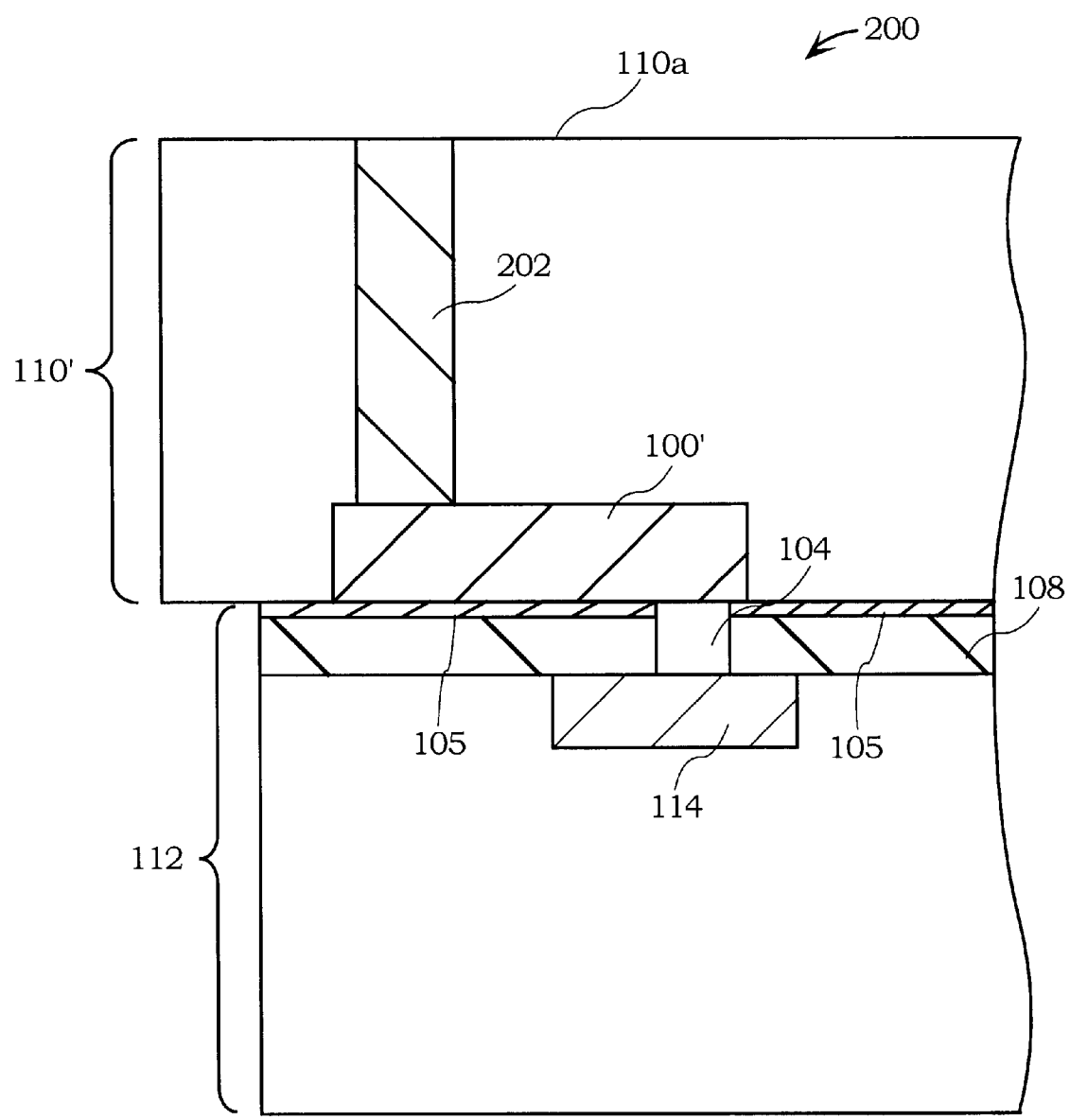
FIG. 2B is a more detailed view of FIG. 2A, in which the conductive bonding via is shown being interconnected down to the metallization bonding structure.

FIG. 2B is a more detailed view 200 of FIG. 2A, in which the conductive bonding via 202 is shown being interconnected down to the metallization bonding structure 100'. In this example, the IC chip 112 is attached to the package 110' via a suitable interface dielectric 105. The interface dielectric 105 can be, for example, an adhesive insulator material that allows proper joining of the IC chip 112 to the package 110'. The conductive bonding vias 202 will therefore provide a path from the top surface 110a of the package 110' down to the metallization bonding structure 100'. In this manner, suitable electrodes can be made to contact the conductive bonding vias to apply the appropriate current through the metallization bonding structure 100', in order to form the appropriate bond between the on-chip metallization pad 114 and the package 110'.

Figure 2C:
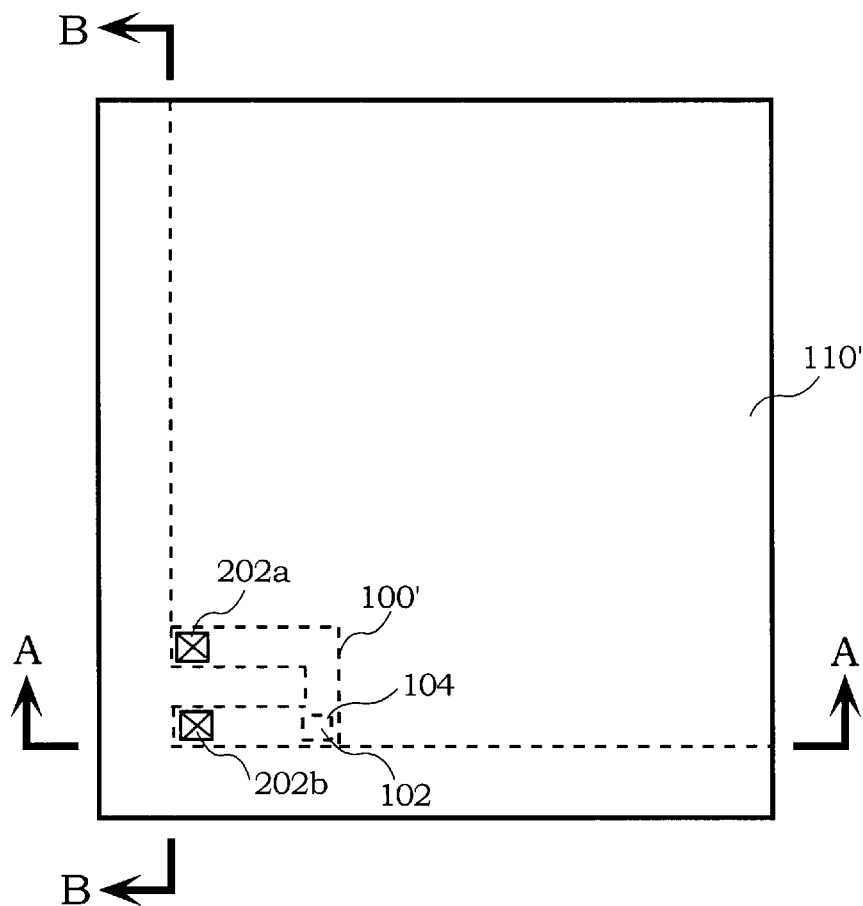
FIG. 2C shows a top view of the package having one exemplary metallization bonding structure defined such that an electromigration stress region occurs at a corner that underlies the via.
Figure 2D:
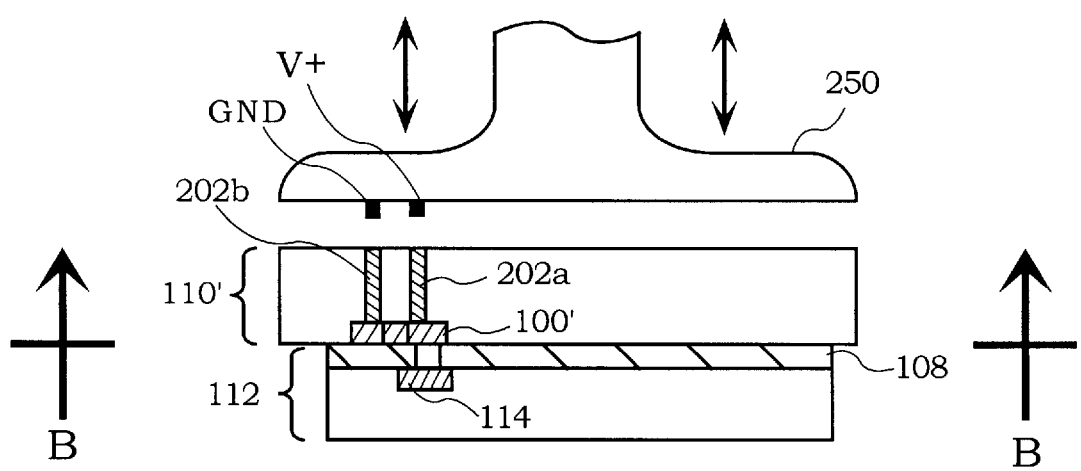
FIGS. 2D and 2E show an electrode before and after it is lowered onto the package, such that the bonding pins make contact with the conductive bonding vias.

FIG. 2C shows a top view of the package 110' having one exemplary metallization bonding structure 100' defined such that an electromigration stress region 102 occurs at a corner that underlies the via 104. From cross section B-B, it is evident that the conductive bonding vias 202 will make contact down to respective ends of the metallization bonding structure 100'. By implementing the conductive bonding vias 202a and 202b, for example, a suitable electrode 250 of FIG. 2D may be implemented to cause the application of the current through the metallization bonding structure 100'.

As will be discussed below, the electrode 250 can be configured to perform the bonding of each of the interconnections between the IC chip 112 and the package 110' all one time. For example, the electrode 250 can have a plurality of bonding pins that are suitably configured to make contact with the conductive bonding vias 202. The bonding pins will thus be programmable to apply either a positive voltage at one pin and a ground voltage at the complementary pin for enabling the BEM process using the metallization bonding structure 100'.

Figure 2E:
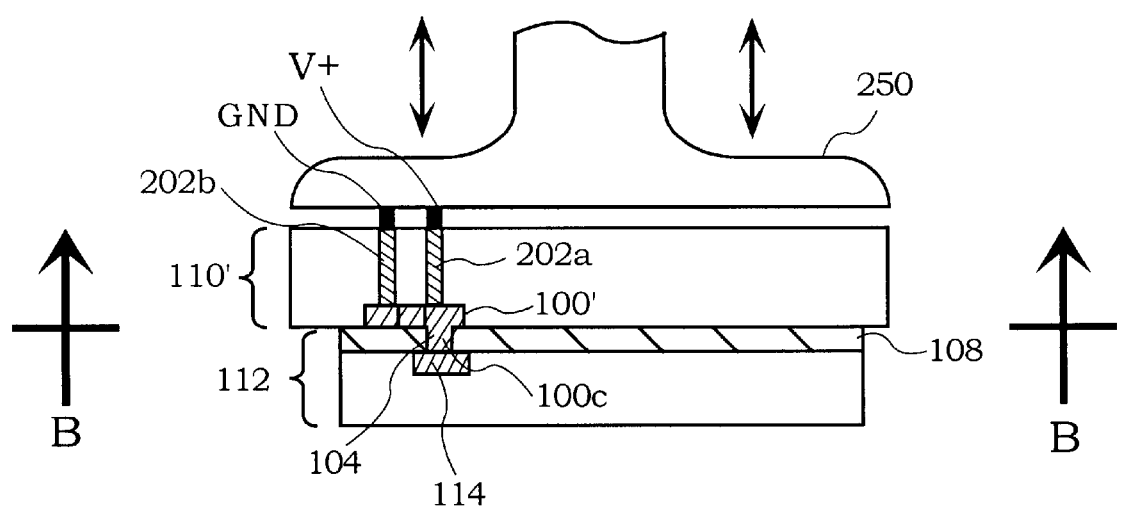

In this example, FIG. 2E shows how the electrode 250 is lowered onto the package 110' such that the bonding pins make contact with the conductive bonding vias 202 (i.e., that define bonding contact points for the electrode 250). Ground is applied to the conductive bonding via 202b and a positive voltage is applied to the conductive bonding via 202a. When such voltage potential is applied, a suitable amount of current is caused to flow through the metallization bonding structure 100' such that the underlying bonding via 104 gets filled and an electrical connection is established between the on-chip metallization pad 114 and the metallization of the chip 110'.

Figure 3A:
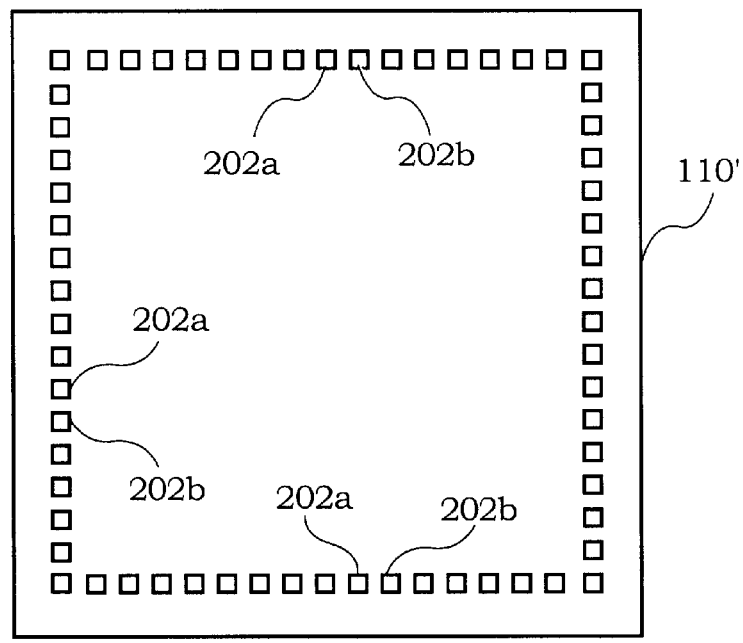
FIG. 3A is a top view of the package having a plurality of conductive bonding vias designed along the periphery of the package, in accordance with one embodiment of the present invention.

FIG. 3A is a top view of the package 110' having a plurality of conductive bonding vias 202 designed along the periphery of the package, in accordance with one embodiment of the present invention. As can be appreciated, pairs of the conductive bonding vias, such as 202a and 202b, are configured to make electrical contact down to the metallization bonding structure 100 or 100'. Because the conductive bonding vias 202 can be designed with a very tight pitch relative to one another, it is possible to design substantially more conductive bonding vias throughout the package 110', and thus enable for more dense designs of the on-chip metallization pads 114.

Figure 3B:
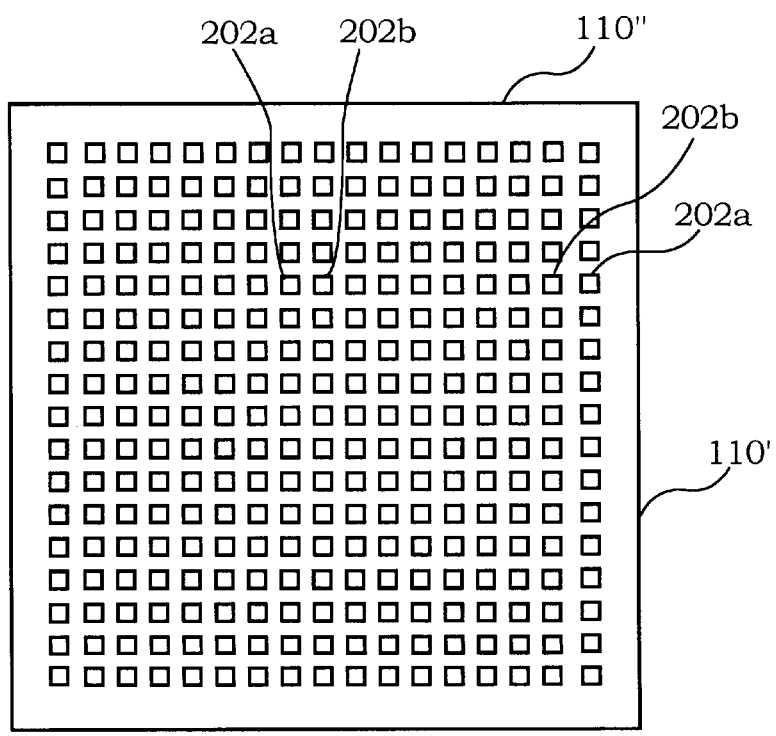
FIG. 3B shows yet another embodiment of the present invention in which a package has an array of conductive bonding vias designed throughout the package.

FIG. 3B shows yet another embodiment of the present invention in which a package 110" has an array of conductive bonding vias 202 designed throughout the package. Accordingly, pairs of the conductive bonding vias, e.g., 202a and 202b, are patterned such that electrical contact is made to complimentary ends of the metallization bonding structure 100/100' that is designed at the lower portion of the package 110".

Figure 4A:
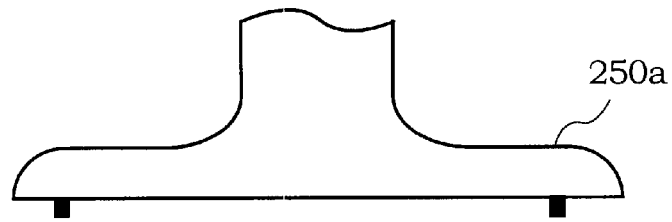
FIGS. 4A and 4B illustrate different embodiments of the electrode.
Figure 4B:
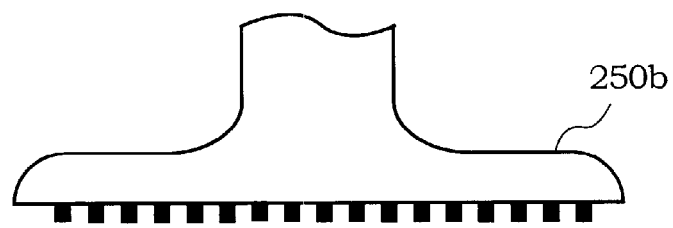

FIGS. 4A and 4B illustrate different embodiments of the electrode 250, in accordance with one embodiment of the present invention. As shown in FIG. 4A, an electrode 250a has a plurality of bonding pins which are designed to contact the periphery of the conductive bonding vias 202a and 202b as shown in FIG. 3A. Alternatively, the electrode 250b can be configured to include an array of bonding pins that are configured to mate with associated ones of the conductive bonding vias 202 of FIG. 3B.

Figure 5:
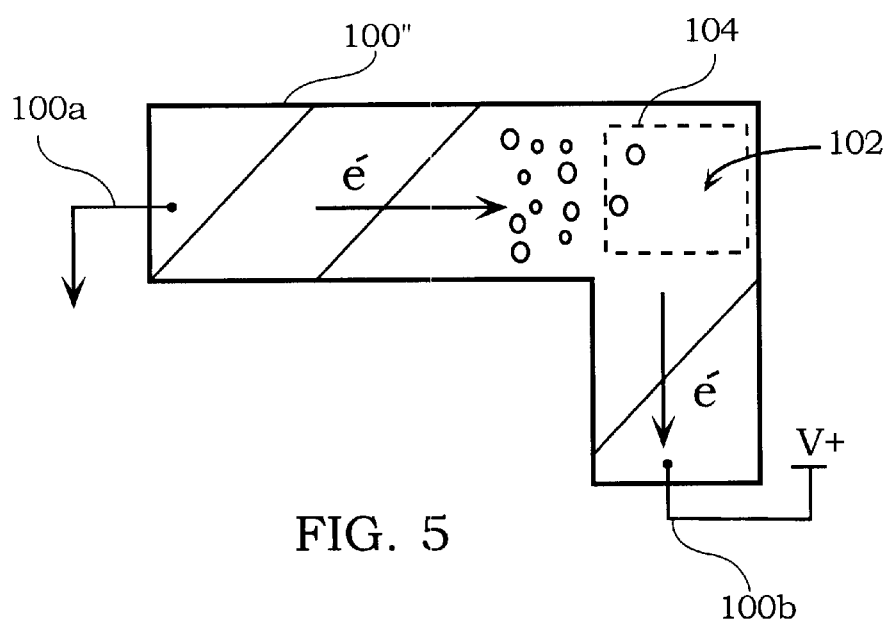
FIG. 5 illustrates yet another embodiment of the metallization bonding structure.

FIG. 5 illustrates yet another embodiment of the metallization bonding structure 100". This illustration is provided to make clear that the metallization bonding structure can be of any particular shape, so long as a bend is provided in order to create the electromigration stress region 102. By creating the electromigration stress region 102, it will be possible to cause the electromigrating metallization atoms to flow down into an underlying bonding via 104. As such, the actual physical geometry of the metallization bonding structure can change as well as the direction in which electrons are caused to flow.

Figure 6A:
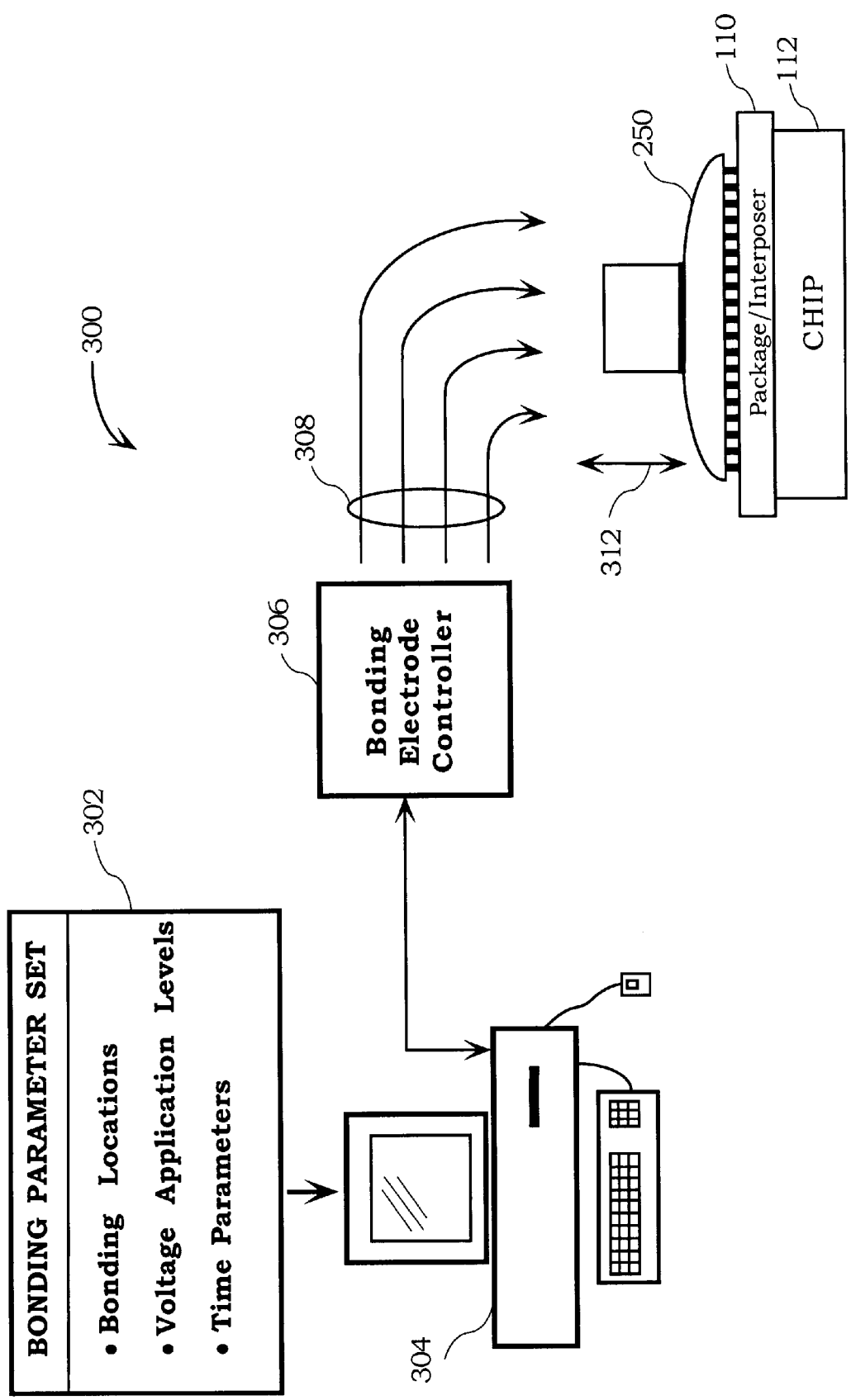
FIG. 6A shows a single-chip bonding system that can be implemented to carry out the bonding by electromigration (BEM) process in accordance with one embodiment of the present invention.

FIG. 6A shows a single chip bonding system 300 that can be implemented to carry out the bonding by electromigration (BEM) process in accordance with one embodiment of the present invention. As shown, a bonding parameter set 302 is first configured to identify bonding locations throughout the package 110 as well as voltage application levels, and time parameters (e.g., typically between about 30 seconds and 5 minutes) for applying the voltages to the package 110. Once the bonding parameter set 302 is provided to a computer system 304, the computer system 304 is configured to communicate the bonding parameters to a bonding electrode controller 306.

The bonding electrode controller 306 is configured to communicate bonding signals 308 to the electrode 250. In general, the electrode 250 can be connected to a mechanical arm (not shown) which will lower the electrode 250 in a vertical direction 312 onto the package 110. Of course, the package can also be an interposer or any other suitable substrate that is configured to be bonded to the chip 112. Once the electrode 250 is lowered onto the appropriate conductive bonding vias of the package 110, the bonding electrode controller will provide the bonding signals 308 to the electrode 250 to effectuate the bonding by electromigration (BEM) process.

Figure 6B:
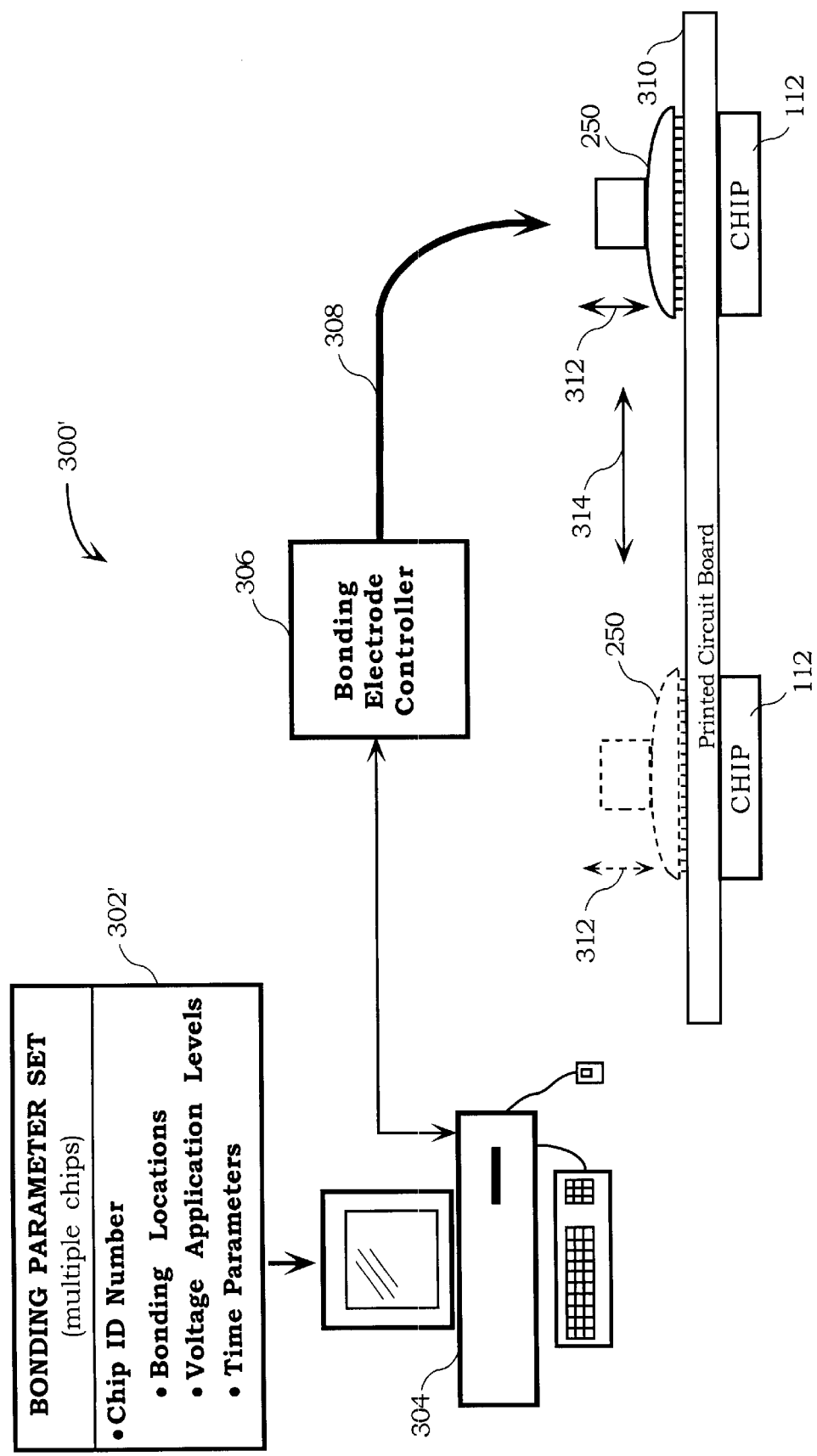
FIG. 6B shows yet another embodiment of the present invention in which a multiple-chip bonding system is implemented.

FIG. 6B shows yet another embodiment of the present invention in which a multiple-chip bonding system 300' is implemented. In this embodiment, the bonding parameter set 302' is designed to receive information about the multiple chips 112 throughout a substrate or printed circuit board 310. In general, the bonding parameter set 302' may include a chip ID number for the appropriate chip which requires bonding. Once the chip ID number is provided by the user, the appropriate bonding locations, voltage application levels, and time parameters will be know and then provided to the bonding electrode controller.

In this example, the electrode 250 is shown capable of being lowered in the vertical direction 312, and moved in a horizontal direction 314 depending upon the location of the chip 112. Moving of the electrode 250 can be accomplished with a suitable mechanical arm that is in communication with the bonding electrode controller 306.

After the electrode 250 is moved to the appropriate location over the printed circuit board 310, the bonding signals 308 are received from the bonding electrode controller 306 to effectuate the bonding by electromigration (BEM) process. Once bonding is complete for one chip, the electrode 250 will move to another location over the printed circuit board 310 to repeat the bonding process for the appropriate chip 112.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A process for connecting a semiconductor chip to a substrate, comprising:
   providing the substrate that is configured to receive the semiconductor chip having a bonding pad, the substrate having a first side that is suited to be connected to the semiconductor chip and a second side that is opposite the first side;
   designing a metallization bonding structure on the first side of the substrate, the metallization bonding structure having a first end, a second end, and a bend defined between the first end and the second end;
   designing an oxide passivation layer over the first side that includes the metallization bonding structure;
   defining a bonding via through the passivation layer, the bonding via is configured to be aligned with the bend of the metallization bonding structure;
   joining the semiconductor chip to the oxide passivation layer, such that the bonding pad is aligned with the bonding via and the bend of the metallization bonding structure; and
   applying a current between the first end and the second end of the metallization bonding structure, the applied current is configured to cause a flow of electrons in an opposite direction of the current and a flow of metallization atoms in the metallization bonding structure toward the bend and into the bonding via, thereby establishing a conductive bond between the substrate and the bonding pad of the semiconductor chip.

2. A process for connecting a semiconductor chip to a substrate as recited in claim 1, wherein the applying of the current further comprises:
   connecting the first end of the metallization bonding structure to a positive power supply and the second end to ground, a voltage differential between the first end and the second end and an associated resistance of the metallization bonding structure is configured to define the applied current.

3. A process for connecting a semiconductor chip to a substrate as recited in claim 2, further comprising:
   defining a first conductive via that is configured to extend between the second side of the substrate and the first end of the metallization bonding structure; and
   defining a second conductive via that is configured to extend between the second side of the substrate and the second end of the metallization bonding structure.

4. A process for connecting a semiconductor chip to a substrate as recited in claim 3, further comprising:
   defining bonding contact points at a top surface of the first and second conductive vias.

5. A process for connecting a semiconductor chip to a substrate as recited in claim 4, wherein the bonding contact points are configured to mate with a bonding electrode that supplies the voltage differential between the first end and the second end of the metallization bonding structure.

6. A process for connecting a semiconductor chip to a substrate as recited in claim 2, wherein the flow of metallization atoms creates an electromigration stress region at about the bend, such that the electromigration stress of the electromigration stress region is partially relived by the flow of metallization atoms into the bonding via.

7. A process for connecting a semiconductor chip to a substrate as recited in claim 6, wherein the substrate is one of a package substrate and a printed circuit board substrate.

8. A system for bonding a semiconductor chip having a plurality of bonding pads to a substrate, comprising:
   defining a plurality of metallization bonding structures throughout the substrate, the metallization bonding structures having a first end, a second end, and a bend that is between the first end and the second end;
   defining an insulator layer between the plurality of bonding pads and the substrate, the insulator layer having a plurality of via holes that align with the bends in each of the metallization bonding structures;
   joining semiconductor chip to the substrate, such that the plurality of bonding pads and the plurality of via holes are aligned with the bends in each of the plurality of metallization bonding structures;
   defining a plurality of conductive bonding vias through the substrate, such that an electrical connection is established between first ends and second ends of the plurality of metallization bonding structures; and
   applying a current to pairs of the plurality of conductive bonding vias, the applying is configured to cause electromigration of metallization atoms along the metallization bonding structure so as to fill the plurality of via holes with the metallization atoms.

9. A system for bonding a semiconductor chip having a plurality of bonding pads to a substrate as recited in claim 8, wherein the applying of the current to pairs of the plurality of conductive bonding vias further comprises:
   a bonding electrode having a plurality of bonding pins, the plurality of bonding pins are configured to make conductive contact with the a plurality of conductive bonding vias, the bonding electrode is configured to communicate a voltage differential to the pairs of the plurality of conductive bonding vias.

10. A system for bonding a semiconductor chip having a plurality of bonding pads to a substrate as recited in claim 8, wherein the plurality of bonding pins are arranged on the bonding electrode to meet a bonding pad arrangement of the semiconductor chip.

11. A system for bonding a semiconductor chip having a plurality of bonding pads to a substrate as recited in claim 10, wherein the bonding arrangement of the semiconductor chip defines the plurality of bonding pads around a periphery of the semiconductor chip.

12. A system for bonding a semiconductor chip having a plurality of bonding pads to a substrate as recited in claim 10, wherein the bonding arrangement of the semiconductor chip defines the plurality of bonding pads in an array over the semiconductor chip.

13. A system for bonding a semiconductor chip having a plurality of bonding pads to a substrate as recited in claim 9, further comprising a bonding electrode controller that is configured to communicate a bonding parameter set to the bonding electrode.

14. A system for bonding a semiconductor chip having a plurality of bonding pads to a substrate as recited in claim 13, where in the bonding parameter set includes data regarding bonding locations associated with the metallization bonding structures, voltage application levels for generating the applied current, and time parameters for setting a time to place the bonding electrode over the conductive bonding vias.

15. A system for bonding a semiconductor chip having a plurality of bonding pads to a substrate as recited in claim 13, wherein the substrate is one of a package and a printed circuit board.

16. A system for bonding a semiconductor chip having a plurality of bonding pads to a substrate as recited in claim 8, wherein the insulator layer is either part of the semiconductor chip or the substrate.

17. A method for bonding a semiconductor chip having a plurality of bonding pads to a package, the method comprises:

forming a plurality of metallization bonding structures throughout the package, the metallization bonding structures having a first end, a second end, and a bend that is between the first end and the second end;

forming an insulator layer between the plurality of bonding pads and the package, the insulator layer having a plurality of via holes that align with the bends in each of the metallization bonding structures;

attaching the semiconductor chip to the package, such that the plurality of bonding pads and the plurality of via holes are aligned with the bends in each of the plurality of metallization bonding structures;

defining a plurality of conductive bonding vias through the package, such that an electrical connection is established between first ends and second ends of the plurality of metallization bonding structures; and applying a current to pairs of the plurality of conductive bonding vias, the applying is configured to cause electromigration of metallization atoms along the metallization bonding structure so as to fill the plurality of via holes with the metallization atoms, the filled plurality of via holes thereby defining electrical bonds between the semiconductor chip and the package.

18. A method for bonding a semiconductor chip having a plurality of bonding pads to a package as recited in claim 17, wherein the applying of the current to pairs of the plurality of conductive bonding vias further comprises:

implementing a bonding electrode having a plurality of bonding pins, the plurality of bonding pins are configured to make conductive contact with the a plurality of conductive bonding vias, and the bonding electrode is configured to communicate a voltage differential to the pairs of the plurality of conductive bonding vias.

19. A method for bonding a semiconductor chip having a plurality of bonding pads to a package as recited in claim 18, wherein the plurality of bonding pins are arranged on the bonding electrode to meet a bonding pad arrangement of the semiconductor chip.

20. A method for bonding a semiconductor chip having a plurality of bonding pads to a package as recited in claim 19, wherein the bonding arrangement of the semiconductor chip defines the plurality of bonding pads either around a periphery of the semiconductor chip or in an array arrangement.

* * * * *